US011442095B2

(12) United States Patent
Hülsen et al.

(10) Patent No.: US 11,442,095 B2
(45) Date of Patent: Sep. 13, 2022

(54) CABLE HARNESS TEST SYSTEM AND TEST METHOD FOR CHECKING CABLE HARNESSES

(71) Applicant: Airbus Operations GmbH, Hamburg (DE)

(72) Inventors: Peter Hülsen, Hamburg (DE); Özgür Yamac, Hamburg (DE)

(73) Assignee: Airbus Operations GmbH ( * ) Notice: Subject to any disclaimer, the term of this patent is extended or adjusted under 35 U.S.C. 154(b) by 424 days.

(21) Appl. No.: 16/536,775

(22) Filed: Aug. 9, 2019

(65) Prior Publication Data
US 2020/0064387 A1 Feb. 27, 2020

(30) Foreign Application Priority Data
Aug. 24, 2018 (DE) ...................... 10 2018 214 326.9

(51) Int. Cl.
G01R 31/00 (2006.01)
G01R 31/08 (2020.01)
B64F 5/60 (2017.01)

(52) U.S. Cl.
CPC ............. *G01R 31/008* (2013.01); *B64F 5/60* (2017.01); *G01R 31/088* (2013.01); *B64D 2221/00* (2013.01)

(58) Field of Classification Search
CPC .... G01R 31/008; G01R 31/088; G01R 31/58; B64F 5/60; B64D 2221/00
USPC ....................................................... 324/503
See application file for complete search history.

(56) References Cited

U.S. PATENT DOCUMENTS

| 4,218,745 A | 8/1980 | Perkins |
| 4,951,385 A | 8/1990 | DeSanto |
| 5,036,479 A * | 7/1991 | Prednis ................. G01D 18/00 702/121 |
| 6,442,498 B1 * | 8/2002 | Krigel .................... G01R 31/58 702/108 |

(Continued)

FOREIGN PATENT DOCUMENTS

| DE | 10 2012 200 115 A1 | 7/2013 |
| DE | 10 2011 087 152 B4 | 8/2013 |
| EP | 0450806 A2 | 10/1991 |

(Continued)

OTHER PUBLICATIONS

European Search Report from EP Application 19188065.7 dated Dec. 12, 2019, pp. 1-7.

*Primary Examiner* — Farhana A Hoque
(74) *Attorney, Agent, or Firm* — Lerner, David, Littenberg, Krumholz & Mentlik, LLP

(57) ABSTRACT

A cable harness test system includes a cable tester that has a microcomputer and a multiplicity of first test point connections for connecting first ends of a multiplicity of electrical lines of a cable harness and is designed to feed line test signals into the multiplicity of electrical lines of the cable harness at the first test point connections, and also a multiplicity of interface simulation devices that each have a multiplicity of second test point connections for connecting second ends of the multiplicity of electrical lines of the cable harness and are each designed to return line test signals received from the cable tester at the second test point connections to the cable tester by the multiplicity of electrical lines of the cable harness.

10 Claims, 1 Drawing Sheet

(56) References Cited

U.S. PATENT DOCUMENTS

2011/0153235 A1 6/2011 Thomas et al.
2013/0187661 A1 7/2013 Henkel

FOREIGN PATENT DOCUMENTS

EP 0784210 A2 7/1997
WO 2018/065731 A1 4/2018

* cited by examiner

CABLE HARNESS TEST SYSTEM AND TEST METHOD FOR CHECKING CABLE HARNESSES

FIELD OF THE INVENTION

The invention relates to a cable harness test system, in particular for use in the wiring of aircraft subassemblies during production. The invention is furthermore concerned with methods for testing cable harnesses, in particular when checking cable harnesses for functionality during the production of aircraft subassemblies.

BACKGROUND OF THE INVENTION

In modern aircraft today, many electrical lines are needed, which are combined in cable harnesses or cable runs in the aircraft subassemblies in an appropriate manner. In this case, it is important to check the lines for operability or for any defects before, after and during installation in the aircraft subassemblies. Defects of this kind, such as for example damage during installation, incorrect wiring or the like, should as far as possible be able to be spotted during production for ease of efficiency.

The document U.S. Pat. No. 5,036,479 A discloses for example a modularized automatic test system for avionic components during production. The document DE 10 2012 200 115 A1 discloses an inspect system for plug connectors in aircraft. The document U.S. Pat. No. 4,218,745 A discloses a microcomputer-based test system for electrical cable runs. The document WO 2018/065731 A1 discloses a method for locating defects in electrical lines of an aircraft. The document US 2011/0153235 A1 discloses a method and a system for testing electrical wiring of complex systems.

BRIEF SUMMARY OF THE INVENTION

Aspects of the invention may provide solutions for testing electrical cable harnesses in aircraft subassemblies that reduce the production time for the aircraft subassemblies.

According to first aspect of the invention, a cable harness test system comprises a cable tester that has a microcomputer and a multiplicity of first test point connections for connecting first ends of a multiplicity of electrical lines of a cable harness and is designed to feed line test signals into the multiplicity of electrical lines of the cable harness at the first test point connections, and also a multiplicity of interface simulation devices that each have a multiplicity of second test point connections for connecting second ends of the multiplicity of electrical lines of the cable harness and are each designed to return line test signals received from the cable tester at the second test point connections to the cable tester by means of the multiplicity of electrical lines of the cable harness.

According to a second aspect of the invention, a test method for checking cable harnesses to be installed in aircraft subassemblies comprises the steps of connecting a cable tester having a microcomputer and a multiplicity of first test point connections to first ends of a multiplicity of electrical lines of the cable harness, connecting a multiplicity of interface simulation devices, each having a multiplicity of second test point connections, to second ends of the multiplicity of electrical lines of the cable harness, feeding line test signals into the multiplicity of electrical lines of the cable harness by means of the cable tester, and returning the line test signals received from the cable tester at the multiplicity of interface simulation devices to the cable tester by means of the multiplicity of electrical lines of the cable harness.

A fundamental concept of the invention is to replace heavy, expensive and sophisticated external cable harness test stations with flexible, modular and lightweight test kits that can be temporarily installed at suitable nodes of the wiring during wiring and can be actuated to check the cable harnesses or cable runs before, during and after the production of individual aircraft subassemblies.

A particular advantage in the solution according to an aspect of the invention is that production bottlenecks as a result of external test stations can be avoided and electrical defects can be detected directly as they arise. This allows the assembly time for wiring an aircraft subassembly to be considerably reduced.

Advantageous configurations and developments emerge from the description with reference to the figures.

According to some embodiments of the cable harness test system according to the invention, at least some of the multiplicity of interface simulation devices can have microcomputers. Yet other instances of the multiplicity of interface simulation devices can have only analogue circuits in some embodiments of the cable harness test system according to the invention.

According to some further embodiments of the cable harness test system according to the invention, the cable harness test system can furthermore have a monitoring computer that is coupled to the cable tester and designed to evaluate line test signals returned from the multiplicity of interface simulation devices to the cable tester.

In some of these embodiments of the cable harness test system according to the invention, the monitoring computer can in this case be designed to take the line test signals returned from the multiplicity of interface simulation devices to the cable tester as a basis for detecting defects or faults in the lines of the cable harness and to use an output unit to output an information signal about the detected defects or faults.

According to some aspects of the test method according to the invention, the cable tester and the multiplicity of interface simulation devices can be connected to the multiplicity of electrical lines of the cable harness after the cable harness is installed in the aircraft subassembly According to some further aspects of the test method according to the invention, the test method can furthermore comprise the step of evaluating line test signals returned from the multiplicity of interface simulation devices to the cable tester by means of a monitoring computer coupled to the cable tester.

In this case, the evaluating of the monitoring computer in some aspects of the test method according to the invention can comprise detecting defects or faults in the lines of the cable harness on the basis of line test signals returned from the multiplicity of interface simulation devices to the cable tester and outputting an information signal about the detected defects or faults.

The detected defects or faults in this case can be cable fractures, shorts, loose connections, incorrect wiring and/or open lines, inter alia.

The above configurations and developments can be combined with one another arbitrarily, as far as appropriate. Further possible configurations, developments and implementations of the invention are also combinations of features of the invention described above or below for the exemplary embodiments that are not explicitly cited. In particular, a person skilled in the art will also add individual aspects as improvements or additions to the respective basic form of the present invention.

BRIEF DESCRIPTION OF THE DRAWINGS

The present invention is explained more specifically below on the basis of the exemplary embodiments indicated in the schematic figures, in which.

DETAILED DESCRIPTION

Figure 1:
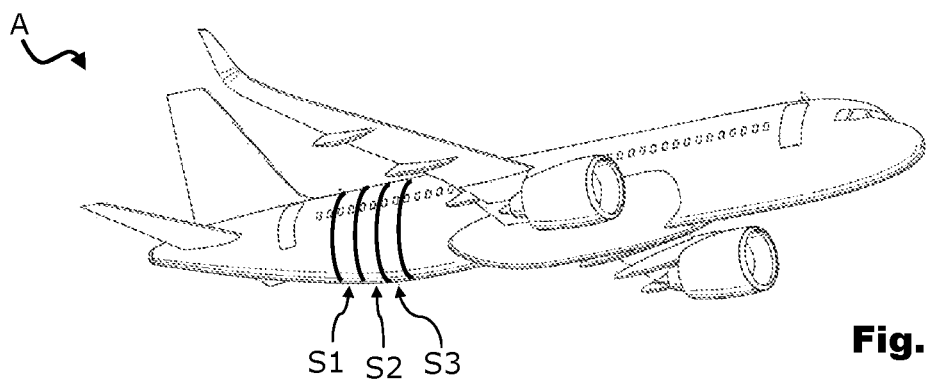
FIG. 1 shows an illustration of an aircraft with indicated fuselage sections according to one embodiment of the invention.

The accompanying figures are intended to convey a further understanding of the embodiments of the invention. They illustrate embodiments and are used in conjunction with the description to explain principles and concepts of the invention. Other embodiments and many of the cited advantages emerge in light of the drawings. The elements of the drawings are not necessarily shown to scale in relation to one another. Direction-indicating terminology such as for example "at the top", "at the bottom", "on the left", "on the right", "above", "below", "horizontally", "vertically", "at the front", "at the rear" and similar statements are merely used for explanatory purposes and do not serve to restrict the generality to specific configurations as shown in the figures.

In the figures of the drawing, elements, features and components that are the same, have the same function and have the same effect are each provided with the same reference signs—unless explained otherwise.

FIG. 1 shows an illustration of an aircraft A, the fuselage of which is constructed from multiple fuselage sections S1, S2, S3. These fuselage sections S1 to S3 are usually produced individually and assembled on a final assembly line to produce a fuselage of the aircraft A. In the process, electrical lines running through multiple instances of the fuselage sections are connected to one another by means of suitable plug connections or node elements during final assembly.

Figure 2:
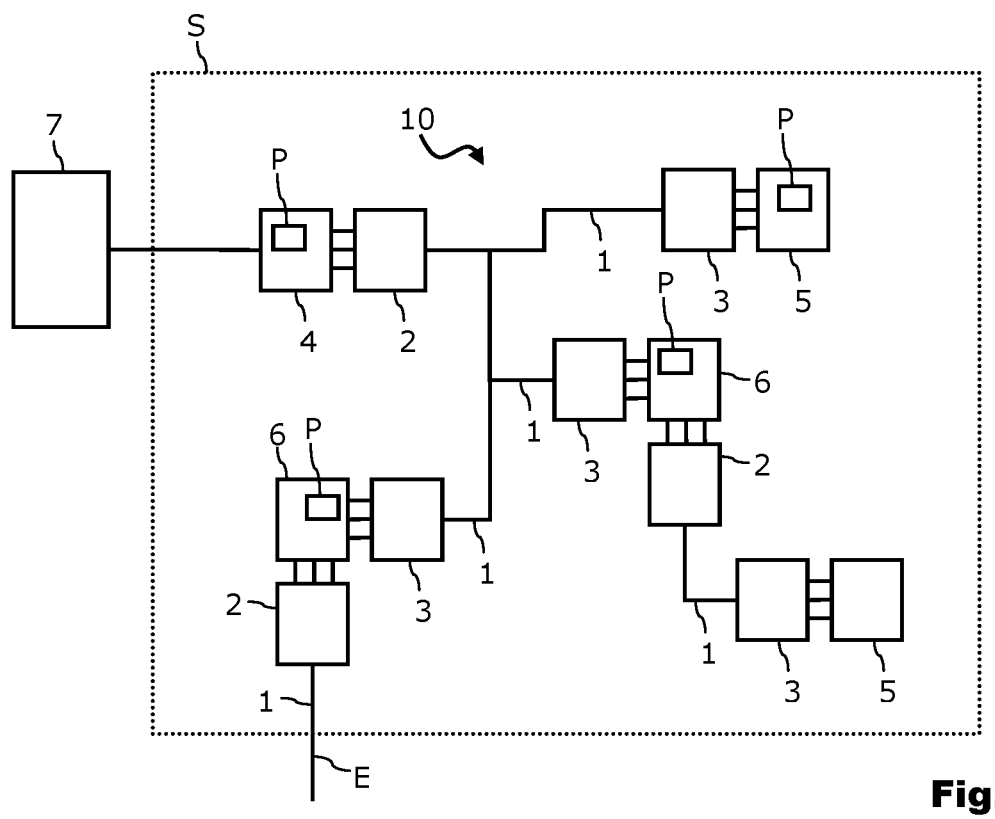
FIG. 2 shows a schematic block diagram of an exemplary cable harness test system inside one of the fuselage sections of FIG. 1 according to a further embodiment of the invention.

FIG. 2 shows a schematic block diagram of an exemplary fuselage section S, such as for example one of the fuselage sections S1 to S3 of FIG. 1, in which a cable harness test system 10 is installed. The cable harness test system 10 can be used during production of the fuselage section S and in particular during and after installation of one or more cable harnesses. The cable harness test system 10 is used for monitoring one or more cable harnesses to be installed in the fuselage section S, so that defects or faults arising such as for example cable fractures, shorts, loose connections, incorrect wiring and/or open lines, can be detected and rectified immediately or promptly after they arise. In the event of a detected defect or fault, the cable harness test system 10 can output appropriate information about the defect or fault together with a description of the defect or fault and an audible and/or visual warning signal to a person responsible for production of the fuselage section S. This person can then react to the detected defect or fault directly. As a result of the defect or fault being handled in a timely manner, the time up until fault rectification can be considerably reduced.

The cable harness test system 10 can remain in the fuselage section S during production of other areas of the fuselage section S until the fuselage section S is ready for final inspection or for transport to final assembly. Up until then, the cable harness test system 10 can continuously monitor the functionality of the lines of the cable harness and of all of the electrical wiring of the fuselage section S. Separate final inspection tests using external cable harness testers are no longer absolutely necessary as a result of the cable harness test system 10.

The cable harness test system 10 comprises a cable tester 4 and also multiple interface simulation devices 5 and 6. The cable tester 4 is used as a central network element and has a microcomputer P for generating, analysing and forwarding a multiplicity of different line test signals adaptable to suit the type cable harnesses to be tested. A multiplicity of first test point connections can each be used to connect the first ends 2 of lines 1 of a cable harness to the cable tester 4. the first ends 2 can have suitable adapters, interface connections or connectors in this case.

Gradually, a multiplicity of electrical lines 1 of the cable harness are laid. Interface simulation devices 5 and 6 are then connected to respective ends 3 of the lines opposite from the first ends 2. The interface simulation devices 5 and 6 can have second test point connections in this case, by means of which the second ends 3 of the multiplicity of electrical lines 1 of the cable harness can be connected, for example by means of appropriate connectors, adapters or interface connections, depending on the type and operation of the lines 1.

FIG. 2 shows different possible variants for the interface simulation devices. Some of the interface simulations devices 5 can, like the cable tester 4, have a microcomputer P that can simulate terminals to be connected to the second ends 3. Some of the interface simulation devices 5 can have only analogue circuits, however, such as for example diode circuits, analogue filters or terminating resistors, in order to simulate applicable electrical behaviour at the two ends 3. Yet other instances of the interface simulation devices 6 can have a microcomputer P and be suitable for passing through signals to further line sections 1 of the cable harness. The interface simulation devices 6 can have third test point connections, for example, by means of which lines 1 can have their first ends 2 connected. The second ends 3 of these lines 1 can in turn have further interface simulation devices connected to them, such as for example interface simulation devices 5 having microcomputers P or only having analogue circuits.

The network of lines 1 thus produced allows the cable tester 4 to run line test signals. These line test signals can be generated in adaptable fashion by the cable tester 4 and fed into the multiplicity of electrical lines 1 of the cable harness via the first test point connections. The interface simulation devices 5, 6 each receive one of the line test signals via the respectively connected instance of the lines 1 and each return suitable response signals for the line test signals to the cable tester 4. In this case, the line test signals can be returned via the second test point connections and the applicable electrical lines 1 of the cable harness.

The cable tester 4 can either evaluate the received returned line test signals itself or hand them over to a monitoring computer 7, such as for example a PC, a laptop or a mobile communication device. The monitoring computer 7 is coupled to the cable tester 4 and can be arranged outside the fuselage section S. for example, in order to provide a person responsible for production with easier access to the information required. The monitoring computer 7 evaluates the line test signals returned from the interface simulation devices 5, 6 to the cable tester 4, for example by virtue of the line test signals returned from the interface simulation devices 5, 6 to the cable tester 4 being taken as a basis for detecting defects or faults in the lines 1 of the cable harness. An output unit (not depicted explicitly in FIG. 2) of the monitoring computer 7 can be used to output information signals about the detected defects or faults to operators, such as for example audible and/or visual warning signals and also descriptions and classifications of the detected defects or faults.

Figure 3:
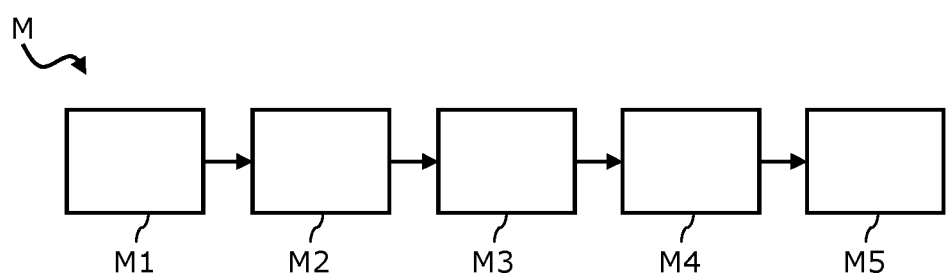
FIG. 3 shows a flow chart for a test method for checking cable harnesses to be installed in aircraft subassemblies according to a further embodiment of the invention.

FIG. 3 illustrates steps of an exemplary test method M for checking a cable harness to be installed in an aircraft subassembly such as for example a fuselage section S. In a first step M1, a cable tester 4 having a microcomputer P and a multiplicity of first test point connections is connected to first ends 2 of a multiplicity of electrical lines 1 of the cable harness. In a second step M2, a multiplicity of interface simulation devices 5, 6, each having a multiplicity of second test point connections, is then connected to second ends 3 of the multiplicity of electrical lines 1 of the cable harness. This connecting of the cable tester 4 and of the multiplicity of interface simulation devices 5, 6 can be effected after the cable harness is completely or partially installed in the aircraft subassembly S, for example.

The cable tester 4 feeds line test signals into the multiplicity of electrical lines 1 of the cable harness in a third step M3, said line test signals being received in a fourth step M4 at the multiplicity of interface simulation devices 5, 6 and returned to the cable tester 4 by means of the multiplicity of electrical lines 1 of the cable harness. It is then possible in a fifth step M5 for line test signals returned from the multiplicity of interface simulation devices 5, 6 to the cable tester 4 to be evaluated by a monitoring computer 7. The monitoring computer 7 can detect for example defects or faults in the lines 1 of the cable harness on the basis of the line test signals returned from the multiplicity of interface simulation devices 5, 6 to the cable tester 4. Furthermore, the monitoring computer 7 can output information signals about the detected defects or faults to an operator of the monitoring computer 7, such as for example audible and/or visual warning signals and also descriptions and classifications of the detected defects or faults, for example detected cable fractures, shorts, loose connections, incorrect wiring and/or open lines.

In the detailed description above, various features have been combined in one or more examples in order to improve the rigorousness of the illustration. However, it should be clear in this case that the above description is of merely illustrative but in no way restrictive nature. It serves to cover all alternatives, modifications and equivalents of the various features and exemplary embodiments. Many other examples will be immediately and directly clear to a person skilled in the art on the basis of his knowledge in the art in consideration of the above description.

The exemplary embodiments have been chosen and described in order to be able to present the principles underlying the invention and their application possibilities in practice in the best possible way. As a result, those skilled in the art can optimally modify and utilize the invention and its various exemplary embodiments with regard to the intended purpose of use. In the claims and the description, the terms "including" and "having" are used as neutral linguistic concepts for the corresponding terms "comprising". Furthermore, use of the terms "a", "an" and "one" shall not in principle exclude the plurality of features and components described in this way.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A cable harness test system, comprising:
    a cable tester having a microcomputer and a multiplicity of first test point connections for connecting first ends of a multiplicity of electrical lines of a cable harness and configured to feed line test signals into the multiplicity of electrical lines of the cable harness at the first test point connections; and
    a multiplicity of interface simulation devices that each have a multiplicity of second test point connections for connecting second ends of the multiplicity of electrical lines of the cable harness and are each configured to return line test signals received from the cable tester at the second test point connections to the cable tester by the multiplicity of electrical lines of the cable harness.

2. The cable harness test system according to claim 1, wherein at least some of the multiplicity of interface simulation devices have microcomputers.

3. The cable harness test system according to claim 1, wherein at least some of the multiplicity of interface simulation devices have only analogue circuits.

4. The cable harness test system according to claim 1, further comprising:
    a monitoring computer coupled to the cable tester and configured to evaluate line test signals returned from the multiplicity of interface simulation devices to the cable tester.

5. The cable harness test system according to claim 4, wherein the monitoring computer is configured to take the line test signals returned from the multiplicity of interface simulation devices to the cable tester as a basis for detecting defects or faults in the lines of the cable harness and to use an output unit to output an information signal about the detected defects or faults.

6. A test method for checking a cable harness to be installed in an aircraft subassembly, comprising:
    connecting a cable tester having a microcomputer and a multiplicity of first test point connections to first ends of a multiplicity of electrical lines of the cable harness;
    connecting a multiplicity of interface simulation devices, each having a multiplicity of second test point connections, to second ends of the multiplicity of electrical lines of the cable harness;
    feeding line test signals into the multiplicity of electrical lines of the cable harness by the cable tester; and
    returning the line test signals received from the cable tester at the multiplicity of interface simulation devices to the cable tester by the multiplicity of electrical lines of the cable harness.

7. The test method according to claim 6, wherein the cable tester and the multiplicity of interface simulation devices are connected to the multiplicity of electrical lines of the cable harness after the cable harness is installed in the aircraft subassembly.

8. The test method according to claim 6, further comprising:
   evaluating line test signals returned from the multiplicity of interface simulation devices to the cable tester by a monitoring computer coupled to the cable tester.

9. The test method according to claim 8, wherein the evaluating of the monitoring computer comprises detecting defects or faults in the lines of the cable harness on the basis of line test signals returned from the multiplicity of interface simulation devices to the cable tester and outputting an information signal about the detected defects or faults.

10. The test method according to claim 9, wherein the detected defects or faults comprise cable fractures, shorts, loose connections, incorrect wiring and/or open lines.

* * * * *